United States Patent [19]

Pullen

[11] 4,272,723
[45] Jun. 9, 1981

[54] POWER FACTOR METER

[76] Inventor: Virgil L. Pullen, 395 Monte Via, Oak View, Calif. 93022

[21] Appl. No.: 3,241

[22] Filed: Jan. 15, 1979

[51] Int. Cl.³ .......................................... G01R 25/00
[52] U.S. Cl. .................................... 324/86; 324/83 D
[58] Field of Search ................... 324/86, 83 R, 83 D, 324/52, 83 A; 328/133, 109

[56] References Cited

U.S. PATENT DOCUMENTS

| 2,249,166 | 7/1941  | Parker et al. | 324/52   |
| 3,514,695 | 5/1970  | Skarshaug     | 324/133  |
| 3,588,710 | 6/1971  | Masters       | 324/83 D |
| 3,701,013 | 10/1972 | Gilmore       | 324/83 D |
| 3,873,919 | 3/1975  | Vosteen       | 324/72   |
| 3,874,616 | 4/1975  | Buser         | 324/72   |

Primary Examiner—Michael J. Tokar
Attorney, Agent, or Firm—Lyon & Lyon

[57] ABSTRACT

An improved solid state power factor monitoring device is disclosed. The device is isolated from the operator and requires no grounding lead or other direct connection to ground for monitoring power factor in high voltage alternating current carrying power lines. A zero crossing switch is used in combination with sensors and amplifiers to actuate a counter to determine the phase relation between current and voltage in the conductor as a representation of power factor.

8 Claims, 2 Drawing Figures

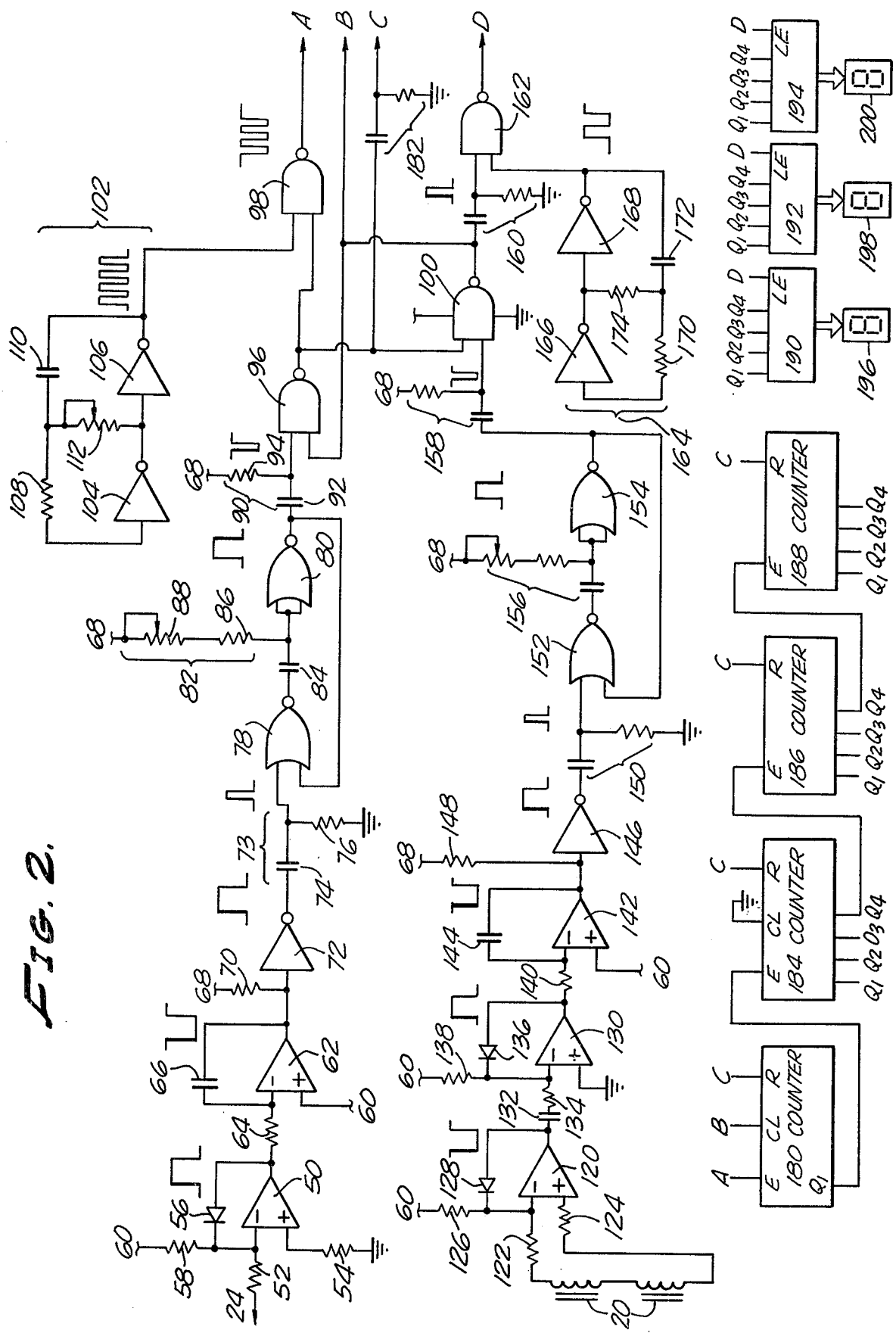

POWER FACTOR METER

BACKGROUND OF THE INVENTION

This invention relates generally to power monitoring devices, and more particularly to devices for monitoring power carried by a conductor, or power factor.

Numerous devices for measuring power factor have been proposed in the past. For example, Rowell U.S. Pat. No. 2,583,798, Rowell U.S. Pat. No. 1,929,289, Hoare U.S. Pat. No. 2,312,904, and Rich U.S. Pat. No. 2,269,225 all disclose early power measuring methods of apparata. Other devices for measuring voltage, current, or power-related quantities are shown in Arndt U.S. Pat. No. 3,471,784, D'Avino U.S. Pat. No. 3,745,457, Caste Pat. No. 3,584,229, Lieberman U.S. Pat. No. 3,621,392, and Hewlett U.S. Pat. No. 3,562,647.

The Hewlett U.S. Pat. No. 3,562,647 discloses an analog device for measuring power factor which is based on the "balanced bridge" principal, in which the phase angle between voltage and current at zero crossings of these waveforms causes the bridge to become unbalanced as an indication of power factor. However, Hewlett appears to require a direct connection between phase and ground, and is therefore inappropriate for field use.

Another approach is provided by either Liebermann U.S. Pat. No. 3,621,392 or Caste U.S. Pat. No. 3,584,299. Each of these patents discloses a power factor meter in which no conductive connection is made to the conductor under test. For example, Liebermann U.S. Pat. No. 3,621,392 discloses a device which can be used to measure power, power factor, current or voltage without a direct conductance connection. However, these devices require contact with or close proximity to the operator, such that the path of the voltage sensing is from the conductor to the meter and then to ground via either capacitance or conductance through the operator. Thus these devices are limited to use with lines of workable voltage.

Thus a need has existed for a device which accurately detects power factor in high voltage power lines, but which also isolates the operator from the detecting circuit.

SUMMARY OF THE INVENTION

The present invention overcomes many of the limitations from which the early devices mentioned above for measuring power factor have suffered. According to one embodiment of the present invention, the device employs a pair of pickups to sense the electrostatic field associated with an energized power line carrying alternating current. In operation instantaneous voltage and current are sensed, and instantaneous power factor is determined therefrom.

More specifically, phase-to-ground voltage is determined via a pickup in the end of an insulated probe by causing the pickup to be placed in contact with the energized conductor. No ground lead is used, and the current path to ground for the voltage measuring portion of the device is via the capacitive coupling of the device through the air to surrounding grounded objects. Once voltage is measured, the signal is amplified and converted to a square wave by sensing the zero crossing of the voltage waveform. The square wave signal triggers a counter, which counts pulses from an independent fixed frequency clock.

At the same time as the voltage is being measured, a representation of current in the conductor is determined by an inductive pickup placed in juxtaposition with the conductor. The current signal is then amplified and converted into a square wave, also by monitoring zero crossings. When the resultant square wave crosses zero, the counter activated by the initial measurement of phase-to-ground voltage is inhibited, and the resultant count, which is the phase lag of current with respect to voltage and is representative of power factor, is indicated on a display.

It is one object of the present invention to provide an improved power factor meter.

It is another object of the present invention to provide a power factor meter in which the operator is removed from the circuit.

Another object of the present invention is to provide a power factor meter in which capacitive coupling is advantageously employed.

Still another object of the present invention is to provide a power factor meter suitable for use by a single individual in the field.

These and other objects of the present invention will be better understood when taken in combination with the detailed description which follows together with the attached drawings, in which FIG. 1 is a diagram of the apparatus; and FIG. 2 is a schematic diagram of the circuitry of the device.

DETAILED DESCRIPTION OF THE INVENTION

Figure 1:
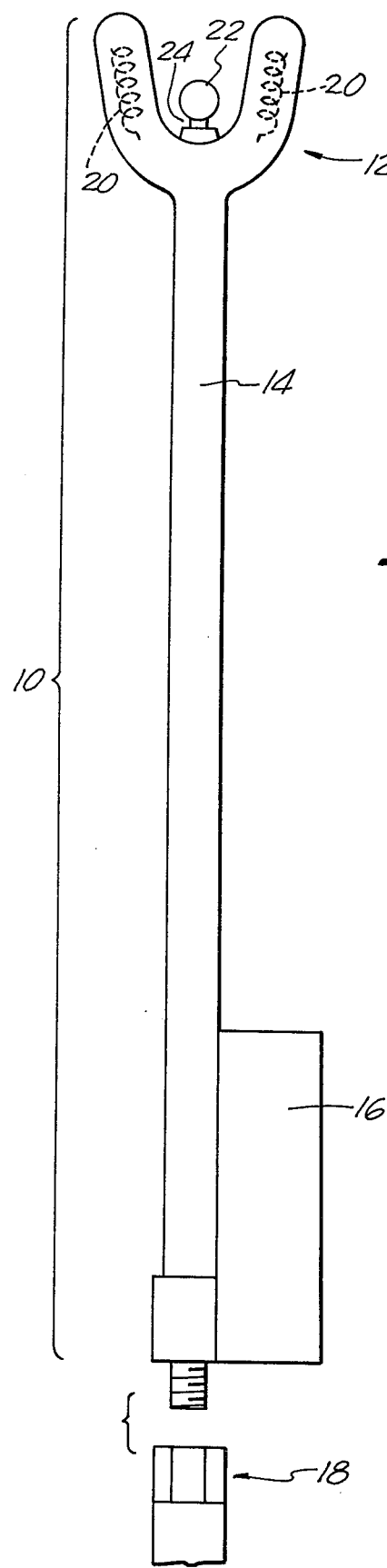

Referring now to FIG. 1, one embodiment of the present invention is shown therein. A device indicated generally at 10 includes a pickup head 12 mounted on an isolation post 15 and in electrical connection with an instrumentation box 16. The entire assembly comprised of the pickup head 12, post 14 and box 16 is preferably mounted on an insulator or "hot stick" 18, only the tip end of which is shown in FIG. 1.

The pickup head 12 includes a pair of inductive coils 20, together with a normally open push-button switch 22 and a voltage probe 24. The box 16 is preferably metal or other suitable electrical conductor, and is electrically connected to the negative terminal of the power supply, typically a battery. The box 16 may be coated with plastic to minimize the possibility of corona discharge, to minimize error.

During normal operation, the pickup head 12 of the device 10 is placed in contact with the energized power line (not shown) carrying alternating current or other similar conductor and is activated by actuating the switch 22, which causes the voltage probe 24 to be placed in contact with the power line. Also, the inductive coils 20 in the pickup head 12 sense the electrostatic field generated by the current flowing in the conductor. No ground lead is used, and the hot stick 18 is provided to isolate the operator from the power line, thereby enabling safe measurement of high voltage/high current power lines without assistance. The box 16, which contains the circuitry discussed hereinafter in connection with FIG. 2, is located remotely from the pickup head 12 to avoid interference with the field surrounding the conductor.

Turning now to FIG. 2, there is shown therein electrical circuitry for one embodiment of the present invention. The voltage probe 24 supplies a signal to the negative input of a zero-crossing amplifier 50 through a resistor 52. The amplifier 50 may for example be a type LM 3900, manufactured by National Semiconductor. The positive input of the amplifier 50 is connected to signal ground through a second resistor 54, preferably of the same value as the resistor 52; both resistors 52 and 54 may for example be 100K ohms. The signal ground to which the positive input of the amplifier 50 is connected is capacitively coupled to ground through the air to surrounding grounded objects, thereby eliminating the need for a ground lead or other ground connection through the operator.

A diode 56 is connected in a feedback loop about the amplifier 50, with the cathode of the diode 56 being connected to the minus input of the amplifier 50. A resistor 58, which may be of the order of ten megohms, is connected between a voltage supply 60, which may for example be on the order of eight-tenths volt, and the negative input of the amplifier 50. The amplifier 50 provides at its out-out a positive-going square wave indicative of the zero crossings of the voltage waveform on the power line or other conductor.

The signal from the amplifier 50 is fed to the input of a squaring and inverting amplifier 62 through a resistor 64. The amplifier 62 may be a National Semiconductor type LM 339, the positive input of which is connected to the voltage supply 60. A capacitor 66 provides feedback between the output of the amplifier 62 and the negative input thereof, thereby providing good rolloff so that the output of the amplifier 62 is a sharp, negative-going squarewave. A voltage supply 68, such as five volts, may be connected to the output of the amplifier 62 through a pull up resistor 70.

The signal from the amplifier 62 is then supplied to another squaring and inverting amplifier 72, which may for example be a National Semiconductor type MM 74C04. The output of the amplifier 72 provides a positive going square-wave, which is then passed through a pulse forming network 73 comprised of a capacitor 74 and a resistor 76, the remote terminal of which is tied to supply ground. Typical values for the capacitor 74 may be on the order of 470 picofarads, while the resistor 76 may have values on the order of 100K ohms. The output signal from the pulse forming network 73 is then a positive going pulse which is supplied to one input of a two input nor gate 78.

The output of the nor gate 78 is supplied to both inputs of a second nor gate 80, the output of the nor gate 80 being supplied to the remaining input of the nor gate 78. The nor gates 78 and 80 form a monostable multivibrator, or one-shot 82 which provides a pulse after a predetermined time delay, once the nor gate 78 is triggered by the signal from the pulse-forming network 73. The time delay is determined by the values of a capacitor 84 in combination with a resistor 86 and variable resistor 88 connected to the output of the nor gate 78. The capacitor 84 may be on the order of 0.1 microfarads, while the resistor 86 may be on the order of 100K ohms. The variable resistor 88, which is connected in series with the resistor 86 and has its remaining terminal connected to the voltage supply 68, serves as a trimming resistor and may be on the order of 50K ohms.

The purpose of the one-shot formed by the nor gates 78 and 80 is to provide proper phasing between voltage and current signals in the device. Since the voltage waveform in the conductor leads the current waveform by 90°, it is necessary to adjust this phasing to provide a proper indication of power factor. However, to ensure accuracy over a varied temperature range, it is desirable to provide a similar monostable multivibrator in the circuitry associated with the current pickups, to be discussed hereinafter. Thus the delays caused by the monostable multivibrators associated with the voltage and current pickups compensate for a 90° phase difference, and may for example be set for 270° and 180°, respectively.

The output of the nor gate 80 is supplied to another pulse forming network 90 comprised of a capacitor 92 in combination with a resistor 94, the remote terminal of which is tied to the voltage supply 68. The pulse forming network 90 may have the same nominal values as the network 73, but is an inverting network, such that the resultant pulse is negative-going. This negative-going pulse is supplied to one input of a nand gate 96, the output of which is supplied to a second nand gate 98 as well as a third nand gate 100.

The remaining input of the nand gate 98 is derived from an oscillator, or clock circuit 102. The clock circuit 102 includes a pair of series connected amplifiers 104 and 106, both of which may be a type MM74C04 manufactured by National Semiconductor. A resistor 108 and a capacitor 110 form a feedback loop between the output of the amplifier 106 and the input of the amplifier 104, with a variable resistor 112 connected between the output of the amplifier 104 and the junction of the capacitor 110 and resistor 108. The clock circuit 102 is nominally designed to provide a clock frequency of 43.2 kHz, although a wide range of frequencies is acceptable. Typical values for the components of the clock circuit 102 are 47K ohms for the resistor 108, 470 picofarads for the capacitor 110 and 20K ohms for the variable resistor 112.

The remaining input to the nand gate 96 is provided by the output of the nand gate 100. It can therefore be seen that the nand gates 96 and 100 are cross-coupled to form a latch, with the set and reset input being provided by the remaining circuitry. The remaining input to the nand gate 100 is provided by circuitry associated with the current sensing portion of the pickup head 12.

The current sensing portion of the pickup head 11 includes a pair of series connected inductive coil 20, the terminals of which are respectively connected to the positive and negative input terminals of a zero-crossing amplifier 120 through a pair of resistors 122 and 124. The amplifier 120 may be of the same type as the amplifier 50. A resistor 126 is connected between the voltage supply 60 and the negative input of the amplifier 120, and the cathode of a feedback diode 128 is also connected to the negative input.

The output of the amplifier 120 is AC coupled to the negative input of a squaring amplifier 130 through a capacitor 132 and resistor 134. The positive input of the amplifier 130, which may be of the same type of the amplifier 120, is connected to the supply ground. A feedback diode 136 and resistor 138 bias the amplifier 130 in the same manner as diode 128 and resistor 126. Since the output of the amplifier 120 was a negative going squarewave, the output of the inverting amplifier 130 is a positive going squarewave. This signal is then supplied through a resistor 140 to a squaring amplifier 142, similar to the amplifier 62. Feedback is provided by a capacitor 144 similar to the capacitor 66.

The negative going squarewave output is then supplied to another squaring amplifier 146, which has a pull-up resistor 148 at its input, similar to the resistor 70. The remaining terminal of the resistor 148 is connected to the voltage supply 68. The output of the amplifier 146 is thus a positive going squarewave, which is fed through a pulse forming network 150 similar to the pulse forming network 73.

The output of the pulse forming network 150 is then fed through a pair of nor gates 152 and 154 together with a second pulse forming network 156 similar to the capacitor 84 and resistors 86 and 88. The output of the nor gate 154 supplies the remaining input to the nor gate 152 similar to the nor gate 78 and 80. Thus the nor gates 152 and 154 form a monostable multivibrator 157 for the current waveform and, together with the monostable multivibrator 82, compensate for the phase difference between voltage and current in the conductor being monitored.

The output of the nor gate 154 is fed through a third pulse forming network 158 similar to the pulse forming network 90, the output of which is a negative-going pulse. This output supplies the remaining input of the nand gate 100, which in turn supplies a signal to another pulse forming network 160 similar to the pulse forming network 150. This results in a positive going pulse that is supplied to one input of a nand gate 162. The remaining input of the nand gate 162 is supplied by a clock circuit 164, comprised of a pair of amplifiers 166 and 168. The amplifiers are biased by a feedback loop comprised of a resistor 170 and capacitor 172, with a second resistor connected between the output of the amplifier 166 and the junction of the resistor 170 and capacitor 172. The clock circuit 164 provides a nominal two Hertz squarewave, and the resistor 170 may nominally be ten megohms, the resistor 174 nominally 3.3 megohms, and the capacitor 172 two-tenths of a microfarad.

The nand gate 98 provides an output on line A, which supplies a signal to the enable input of a first counter 180. The nand gate 100 provides an output on the line B, which provides an input signal to the clock input of the counter 180. The nand gate 96 provides a signal through a pulse forming network 182, similar to the pulse forming network 160, on the line C. The line C provides an input signal to the reset input of the counter 180 as well as the reset inputs of counters 184, 186 and 188. The Q1 output of the counter 180 provides an input to the enable line of the counter 184. Similarly, the Q4 output of the counter 184 provides an enable input to the counter 186. Likewise, the Q4 output of the counter 186 provides an enable output to the counter 188.

The Q1–Q4 outputs of the counter 184 provide inputs to a decoder-driver 190, while the Q1–Q4 outputs of the counter 186 similarly provide inputs to a decoder driver 192. Likewise, the Q1–Q4 outputs of the counter 188 provide the inputs to a third decoder driver 194. The latch enable input to the decoder drivers 190, 192 and 194 are all provided by the line D, or output of the nand gate 162. The decoder drivers 190–194 provide signals to display digits 196, 198 and 200, respectively.

As mentioned briefly above, the device of the present invention operates as follows. The voltage probe 24 is placed in contact with the conductor (not shown). The amplifier 50 senses the zero crossing of the phase-to-ground voltage, which causes a negative going pulse to be formed by the pulse forming network 90. The negative going pulse triggers the nand gate 96, which sets the latch comprised of the nand gates 96 and 100. This fixes the output of the nand gate 96 at a high level, and permits the clock signal from the circuit 102 to trigger the enable on the counter 180.

At the same time as the voltage probe 24 is placed in contact with the conductor, the inductive coils 20 of the current sensing circuit sense the electrostatic field surrounding the conductor, and generate a signal representative of the current waveform in the conductor. Since the current waveform is typically at a different phase than the voltage waveform, the counters 180, 184, 186 and 188 continue to count, via the clock circuit 102, until the current waveform passes through zero. As discussed above, the monostable multivibrators 82 and 157 compensate for the phase difference in voltage and current waveforms not associated with power factor, leaving the counters to provide an accurate indication of power factor.

The resulting pulse formed at the pulse forming network 158 triggers the nand gate 100 and therefore resets the latch comprised of the nand gate 96 and 100. The resetting of the latch disables the nand gate 98, thereby preventing a clock signal from appearing on line A. This in turn stops the counters. Likewise, the stop count signal from the pulse forming network 158 signals the nand gate 162 and provides an output signal on line D. This enables the decoder drivers 190, 192 and 194 to receive the count contained in the counters 180, 185, 186 and 188. The count stored in the counters is then displayed in the display units 196, 198 and 200 as degrees of current lag, or power factor.

Having fully described one embodiment of the invention, numerous alternatives and equivalents will be apparent to those skilled in the art given the teachings herein. The present invention is not intended to be limited to the specific details disclosed herein, but is rather intended to include such alternatives and equivalents.

What is claimed is:

1. Apparatus for determining power factor in an alternating current carrying conductor which isolates the operator of the apparatus from the circuit comprising
   reference signal means for supplying pulses,
   counting means for counting the pulses supplied by said reference signal means,
   voltage sensing means for initializing said counting means in response to a zero crossing of the voltage in the conductor, said voltage sensing means being capacitively coupled to earth ground to electrically isolate an operator from the conductor,
   current sensing means for stopping said counting means in response to a zero crossing of the current in the conductor.

2. Apparatus for determining power factor in an alternating current high voltage power line comprising
   voltage pickup means for sensing voltage zero-crossings,
   current pickup means for sensing current zero-crossings,
   means for determining power factor in response to signals from said voltage pickup means and said current pickup means at least a portion of said power factor determining means being capacitively coupled to earth ground,
   insulator means for electrically isolating an operator of the apparatus from the power line.

3. Apparatus for determining power factor in an alternating current carrying conductor comprising
   voltage pickup means for sensing voltage zero-crossings,
   current pickup means for sensing current zero-crossings,
   pulse means responsive to said voltage pickup means for supplying pulses in response to a voltage zero-crossing, said pulse means being capacitively coupled to earth ground through the atmosphere, counting means for counting the pulses supplied by said pulse means, phase adjusting means for compensating for phase differences between voltage and current not associated with power factor, stopping means responsive to said phase adjusting means and said current sensing means for stopping said counting means when said current pickup means senses a current zero-crossing to provide an indication of power factor.

4. The device of claims 2 or 3 wherein said voltage pickup means and said current pickup means are remotely located from the remainder of the apparatus to minimize interference.

5. The apparatus of claims 1, 2 or 3 wherein at least a part of the apparatus is enclosed in a metal shield to facilitate the capacitive coupling to earth ground.

6. The apparatus of claim 5 wherein the metal shield is coated with plastic to minimize corona discharge.

7. The apparatus of claim 4 wherein said voltage pickup means and current pickup means are substantially eighteen inches from the remainder of the device.

8. The apparatus of claim 3 wherein said phase adjusting means is associated with both said voltage pickup means and said current pickup means to compensate for variations in ambient temperature.

* * * * *